(12) United States Patent
Iwai

(10) Patent No.: US 10,372,377 B2
(45) Date of Patent: Aug. 6, 2019

(54) MEMORY CONTROLLER, MEMORY SYSTEM, AND CONTROL METHOD

(71) Applicant: Toshiba Memory Corporation, Tokyo (JP)

(72) Inventor: Katsuhiko Iwai, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/691,711

(22) Filed: Aug. 30, 2017

(65) Prior Publication Data

US 2018/0275917 A1    Sep. 27, 2018

(30) Foreign Application Priority Data

Mar. 22, 2017   (JP) ................. 2017-056470

(51) Int. Cl.
| | | |
|---|---|---|
| G06F 3/06 | (2006.01) | |
| G11C 11/30 | (2006.01) | |
| G06F 12/04 | (2006.01) | |
| G11C 11/56 | (2006.01) | |

(52) U.S. Cl.
CPC .......... *G06F 3/0659* (2013.01); *G06F 3/0604* (2013.01); *G06F 3/0619* (2013.01); *G06F 3/0658* (2013.01); *G06F 3/0679* (2013.01); *G06F 12/04* (2013.01); *G11C 11/5628* (2013.01)

(58) Field of Classification Search
CPC .. G11C 16/10; G11C 16/3427; G11C 11/5628
See application file for complete search history.

(56) References Cited

U.S. PATENT DOCUMENTS

| | | | |
|---|---|---|---|
| 6,456,528 B1* | 9/2002 | Chen .................. | G11C 11/56 365/185.03 |
| 6,522,580 B2* | 2/2003 | Chen .................. | G11C 11/5621 365/185.02 |
| 6,717,847 B2* | 4/2004 | Chen .................. | G11C 11/56 365/185.03 |
| 6,819,590 B2 | 11/2004 | Goda et al. | |
| 8,108,752 B2 | 1/2012 | Tanaka | |
| 8,171,208 B2 | 5/2012 | Yano et al. | |
| 9,263,136 B1* | 2/2016 | Zhao .................. | G11C 16/10 |
| 9,601,205 B2* | 3/2017 | Yoo .................... | G11C 16/10 |

(Continued)

FOREIGN PATENT DOCUMENTS

JP    2009-225325 A    10/2009

*Primary Examiner* — Midys Rojas
*Assistant Examiner* — Khoa D Doan
(74) *Attorney, Agent, or Firm* — Kim & Stewart LLP

(57) ABSTRACT

A memory controller includes a memory interface that is connected to a non-volatile memory that includes a plurality of memory cells, and a control unit. The control unit controls the memory interface to perform writing of data that has a first number of bits to a first memory cell in an n-bit write mode (where n is 2 or more), and when performing reading of the data written into the first memory cell, to control the memory interface to perform reading of data in an m-bit read mode (where m is less than n), as a result of which data that has a second number of bits which is smaller than the first number of bits, is returned from the first memory cell.

16 Claims, 8 Drawing Sheets

(56) References Cited

U.S. PATENT DOCUMENTS

| | | | |
|---|---|---|---|
| 2005/0007801 A1* | 1/2005 | Barzilai | G11C 11/56 |
| | | | 365/10 |
| 2006/0155919 A1* | 7/2006 | Lasser | G11C 11/5621 |
| | | | 711/103 |
| 2009/0172266 A1* | 7/2009 | Kimura | G06F 12/1408 |
| | | | 711/103 |
| 2010/0042772 A1* | 2/2010 | Bonella | G11C 11/5628 |
| | | | 711/103 |
| 2011/0119431 A1 | 5/2011 | Chowdhury | |
| 2012/0005415 A1* | 1/2012 | Jung | G06F 12/0246 |
| | | | 711/103 |
| 2012/0173827 A1* | 7/2012 | Wood | G11C 11/5621 |
| | | | 711/154 |
| 2015/0078079 A1* | 3/2015 | D'Abreu | G11C 16/10 |
| | | | 365/185.03 |
| 2015/0081952 A1* | 3/2015 | D'Abreu | G06F 12/0246 |
| | | | 711/103 |
| 2015/0169228 A1* | 6/2015 | Sivasankaran | G06F 3/0625 |
| | | | 711/103 |
| 2015/0333774 A1 | 11/2015 | Kaynak et al. | |
| 2016/0041760 A1* | 2/2016 | Kuang | G11C 16/3495 |
| | | | 711/103 |
| 2016/0266826 A1* | 9/2016 | Ooneda | G11C 29/789 |
| 2017/0116076 A1* | 4/2017 | Sharma | G11C 29/02 |
| 2017/0177235 A1* | 6/2017 | Nishikubo | G06F 3/0659 |

\* cited by examiner

FIG. 8

| PHYSICAL ADDRESS | PAGE ID | OPERATION MODE | BLOCK ID | TOTAL NUMBER OF TIMES OF READING |
|---|---|---|---|---|
| ***********1 | #00000001 | HIGH BIT MODE | #0001 | 00001234 |
| ***********2 | #00000002 | HIGH BIT MODE | | |
| ⋮ | ⋮ | ⋮ | | |
| ********1111 | #00001111 | LOW BIT MODE | #1111 | 12345678 |
| ********1112 | #00001112 | LOW BIT MODE | | |
| ⋮ | ⋮ | ⋮ | | |
| ⋮ | ⋮ | ⋮ | ⋮ | ⋮ |

FIG. 10
| DATA VALUE IN LOW BIT MODE | DATA VALUE IN HIGH BIT MODE |
|---|---|
| '1' | '11' |
| '0' | '10' |
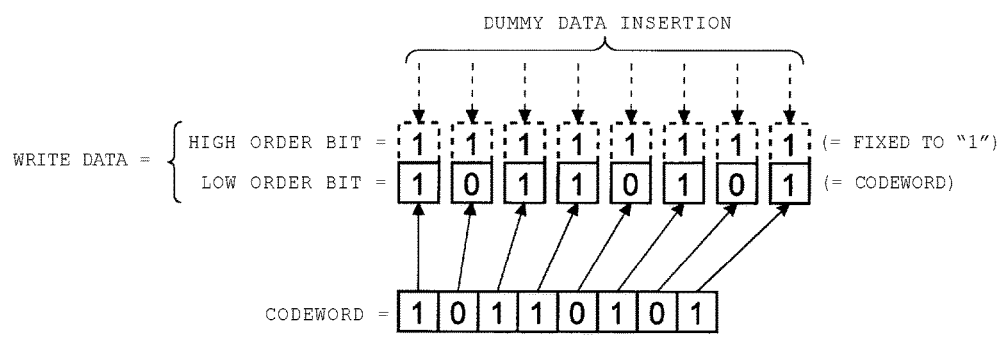
FIG. 11
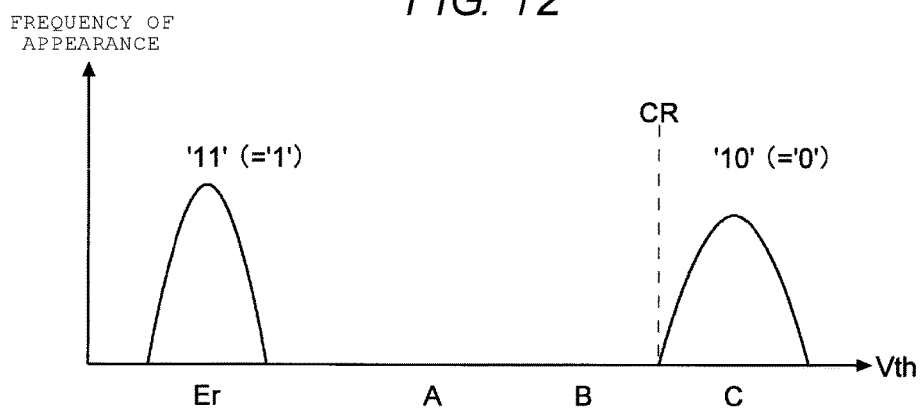
FIG. 12

| PHYSICAL ADDRESS | PAGE ID | TOTAL NUMBER OF TIMES OF READING | OPERATION MODE | BLOCK ID |
|---|---|---|---|---|
| ***********1 | #00000001 | 00001234 | HIGH BIT MODE | #0001 |
| ***********2 | #00000002 | 12345678 | LOW BIT MODE | |
| ⋮ | ⋮ | ⋮ | ⋮ | |
| ********1111 | #00001111 | 00002345 | HIGH BIT MODE | #1111 |
| ********1112 | #00001112 | 23456789 | LOW BIT MODE | |
| ⋮ | ⋮ | ⋮ | ⋮ | |
| ⋮ | ⋮ | ⋮ | ⋮ | ⋮ |

MEMORY CONTROLLER, MEMORY SYSTEM, AND CONTROL METHOD

CROSS-REFERENCE TO RELATED APPLICATION

This application is based upon and claims the benefit of priority from Japanese Patent Application No. 2017-056470, filed Mar. 22, 2017, the entire contents of which are incorporated herein by reference.

FIELD

Embodiments described herein relate generally to a memory controller, a memory system, and a control method.

BACKGROUND

In the related art, a semiconductor memory device that includes a memory cell that retains an amount of charge in accordance with a data value is widely known. In this semiconductor memory device, a data value that is stored in the memory cell is determined based on a relationship between a threshold voltage which is dependent on an amount of charge that is retained in the memory cell and a reading voltage that is set in advance.

DESCRIPTION OF THE DRAWINGS

FIG. 8 is a diagram illustrating an example of a mode management table according to the present embodiment.

FIG. 10 is a diagram illustrating an example of a correspondence table that is used for conversion processing of data according to the present embodiment.

FIG. 11 is a diagram for illustrating another example of the conversion processing of the data according to the present embodiment.

FIG. 12 is a diagram illustrating an example of a writing state of the memory cell in the present embodiment.

DETAILED DESCRIPTION

Embodiments provide a memory controller, a memory system, and a control method that are capable of reducing degradation in performance due to read disturbance.

In general, according to one embodiment, there is provided a memory controller including a memory interface that is connected to a nonvolatile memory that includes a plurality of memory cells, and a control unit. The control unit controls the memory interface to perform writing of data that has a first number of bits to a first memory cell in an n-bit write mode (where n is 2 or more), and when performing reading of the data written into the first memory cell, to control the memory interface to perform reading of data in an m-bit read mode (where m is less than n), as a result of which data that has a second number of bits which is smaller than the first number of bits, is returned from the first memory cell.

A memory controller, a memory system, and a control method according to an embodiment will be described in detail below with reference to the accompanying drawings. It is noted that an exemplary embodiment of the present disclosure is not limited to the following embodiments.

A NAND flash memory (hereinafter referred to as a NAND memory) is a nonvolatile memory that is of a charge retention type. Generally, in the nonvolatile memory that is of the charge retention type, a high voltage is given to a word line when reading data, but when a high voltage is repeatedly applied to the same block, a charge that is unintended is stored in a word line within the block. The charge that is unintentionally stored in the word line can be a factor that causes a reading defect which is referred to as read disturbance. Furthermore, when it comes to a word line adjacent to the word line in which the charge is unintentionally stored, in a case where writing is performed on a word line that corresponds to an erasing-completed erased page (hereinafter referred to a non-selected page) which is not yet writing-controlled, there is a likelihood that a hardware error will occur even immediately after writing.

Accordingly, in the following embodiments, specific examples of the memory controller, the memory system and the control method that is capable of controlling a decrease in performance due to the read disturbance are illustrated.

Figure 1:
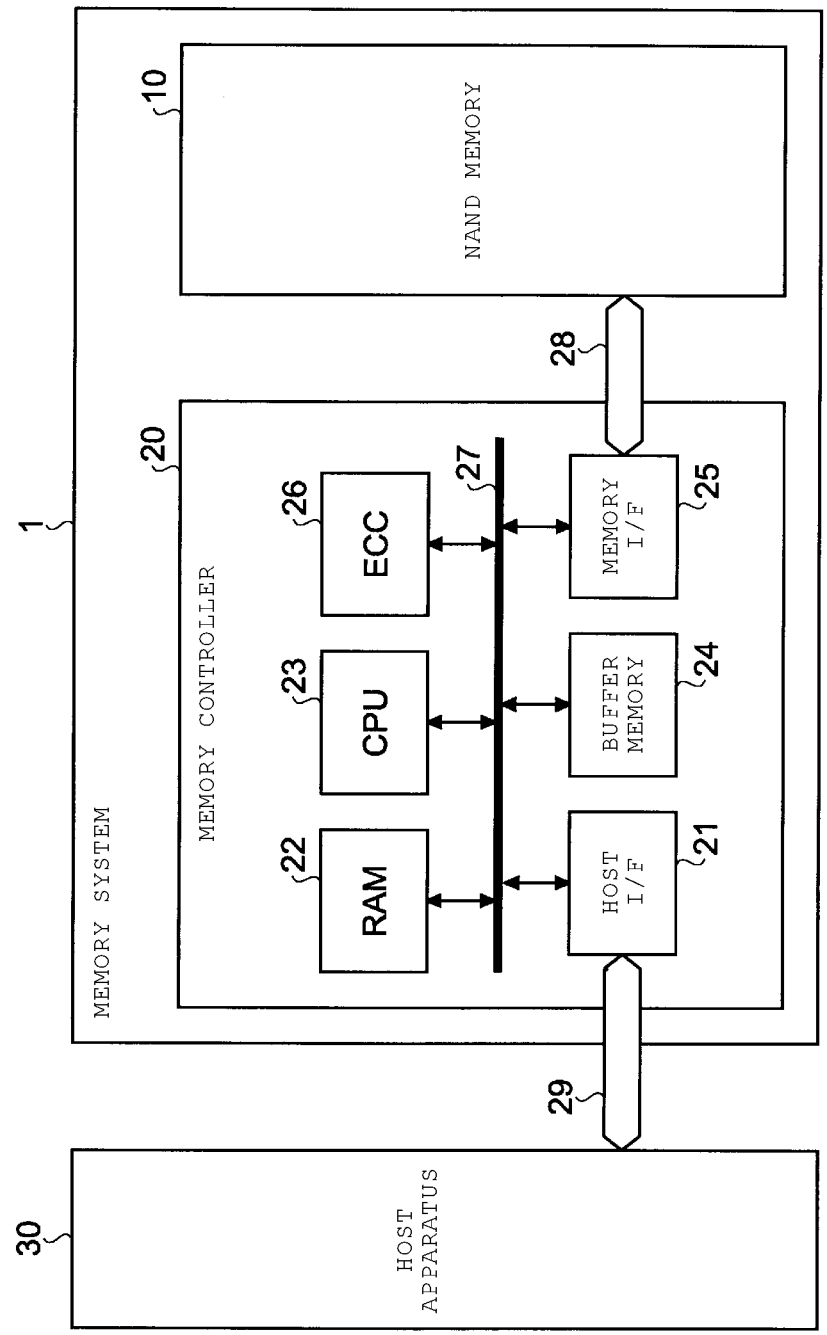
FIG. 1 is a block diagram of a memory system according to a present embodiment.

FIG. 1 is a block diagram of the memory system according to the present embodiment. The memory system 1 includes a NAND flash memory (NAND memory, for short) 10 and a memory controller 20. When it comes to the NAND memory 10 and the memory controller 20, for example, a combination of these may constitute one memory system. Examples of the memory system include a memory card, such as an SD® card, a solid state drive (SSD), and the like.

The NAND memory 10 is a nonvolatile memory that has a structure in which a memory cell is provided at each of the intersections at which a plurality of word lines and a plurality of bit lines intersect. The memory controller 20 is connected to the NAND memory 10 through a NAND bus 28, and is connected to a host apparatus 30 through a host bus 29. The memory controller 20 controls the NAND memory 10. Furthermore, in response to a command that is received from the host apparatus 30, the memory controller 20 accesses the NAND memory 10. The host apparatus 30 has a configuration of a computer. The computer, for example, may be a personal computer, a server apparatus, a portable information device, a digital still camera, or the like. The host bus 29 may be configured to comply with a bus specification of any type.

The NAND bus 28 transmits and receives a signal in accordance with a memory interface. Specific examples of the signal include a chip enabling signal CEn, an address latch enabling signal ALE, a command latch enabling signal CLE, write enabling signal WEn, a read enabling signal REn, a ready and busy signal RBn, an input and output signal I/O, and the like.

The memory controller 20 includes a host interface circuit (host I/F) 21, a random access memory (RAM) 22, a central processing unit (CPU) 23, a buffer memory 24, a memory interface circuit (memory I/F) 25, and an ECC unit (ECC) 26. The host I/F 21, the RAM 22, the CPU 23, the buffer memory 24, the memory I/F 25, and the ECC unit 26 are connected to each other through the internal bus 27.

The host I/F 21 is connected to the host apparatus 30 through the host bus 29, and transfer a command and data that are received from the host apparatus 30, to the CPU 23 and the buffer memory 24, respectively. Furthermore, in response to the command from the CPU 23, the host I/F 21 transfers data within the buffer memory 24 to the host apparatus 30.

The CPU 23 is a control unit that controls operation of the memory controller 20. For example, in response to receiving a write command from the host apparatus 30, the CPU 23 issues the write command to the memory I/F 25 and as necessary, issues a coding command to code user data within the buffer memory 24 to the ECC unit 26. In the same manner as when reading and erasing, in response to receiving a read command from the host apparatus 30, the read command is issued to the memory I/F 25, and as necessary, a decoding command to decode a codeword that is read is issued to the ECC unit 26. Furthermore, the CPU 23 performs various processing operations for managing the NAND memory 10, such as erasing or garbage collection.

The memory I/F 25 is connected to the NAND memory 10 through the NAND bus 28, and controls communication with the NAND memory 10. Based on a command that is received from the CPU 23, the memory I/F 25 outputs the signal ALE, the signal CLE, the signal WEn, and the signal REn to the NAND memory 10. Furthermore, when writing, the memory I/F 25 transfers the write command that is issued by the CPU 23 and writing target data (hereafter referred to as write data) within the buffer memory 24, as input and output signal I/O, to the NAND memory 10. On the other hand, when reading, the memory I/F 25 transfers the read command that is issued by the CPU 23, as the input and output signal I/O, to the NAND memory 10. Additionally, the memory I/F 25 receives data (hereinafter referred to as read data) that is read from the NAND memory 10, as the input and output signal I/O, and transfers the received data to the buffer memory 24.

The buffer memory 24 functions as a memory area in which the user data, the write data, the read data, and the like are temporarily retained. The buffer memory 24 can be configured with a dynamic random access memory (DRAM) (which includes synchronous DRAM), a static random access memory (SRAM), or the like.

The RAM 22, for example, is a semiconductor memory such as a DRAM. The RAM 22 is used as a working area for the CPU 23. Firmware or various management tables for managing the NAND memory 10 are loaded into the RAM 22.

The ECC unit 26 encodes and decodes data in order to perform error detection or error correction on the data that is read. Specifically, the ECC unit 26 codes data that is to be written to the NAND memory 10. Furthermore, the ECC unit 26 decodes data that is read from the NAND memory 10. When decoding, the ECC unit 26 performs the error detection and the error correction on the read data. In a case where the error correction fails, the ECC unit 26 notifies the CPU 23 of the failure of the error correction. In a case where correct data is restored as a result of the decoding, the ECC unit 26 stores the restored data in the buffer memory 24. It is possible that as an algorithm for the coding and the decoding by the ECC unit 26, an arbitrary algorithm is employed.

In the memory system 1 that employs this configuration, for example, writing and reading is performed on the NAND memory 10 on a per unit data basis in which unit data is a page of memory cells, and erasing is performed on a per unit data basis in which the unit data is a block of memory cells. In the present embodiment, a plurality of memory cells that are connected to the same word line is called a memory cell group. In a case where the memory cell is a single level cell (SLC), one memory cell group corresponds to one page. In a case where the memory cell is a multiple level cell (MLC), one memory cell group corresponds to a plurality of pages. Furthermore, each memory cell is connected to not only a word line, but also a bit line. Therefore, it is possible that each memory cell is individually specified using an address that identifies a word line and an address that identifies a bit line.

Subsequently, a writing state of each memory cell in the present embodiment is described in detail with reference to the drawings. It is noted that in the following description, for simplicity, an example in which a memory cell is a two-bit (four-valued) MLC and hard decision reading (referred to as hard bit read) is performed on this memory cell is given as an example.

Figure 2:
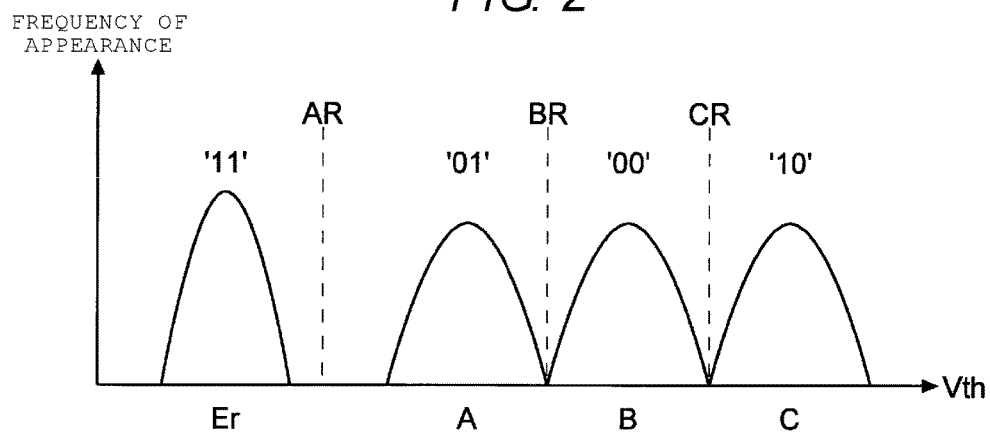
FIG. 2 is a diagram illustrating an example of a relationship between a threshold voltage distribution of memory cells in a writing state or a non-writing state and a data value that is retained by each memory cell.

FIG. 2 is a diagram illustrating an example of a correspondence relationship in the present embodiment, between a distribution (hereinafter referred to as a threshold voltage distribution) of threshold voltages of memory cells in a writing state or a non-writing state, and a data value that is retained by each memory cell. In FIG. 2, the horizontal axis expresses the threshold voltage of the memory cell, and the vertical axis expresses the frequency of appearance (which in some descriptions may represent the probability of appearance) of the memory cell. Therefore, in FIG. 2, Gaussian distributions, which are indicated by "Er" to schematically represent the distributions of the threshold voltages of the memory cell in the writing state or in the non-writing state.

In the four-valued MLC, normally, writing and erasing to and from each memory cell is performed in such a manner that the threshold voltage of the memory cell in the writing state or the non-writing state is included in any one of an Er distribution, an A distribution, a B distribution and a C distribution. Each of these four distributions corresponds to a two-bit data value. For example, the Er distribution corresponds to a data value of "11", the A distribution corresponds to a data value of "01", the B distribution corresponds to a data value of "00", and the C distribution corresponds to a data value of "10".

In the hard decision reading from an MLC memory cell, the threshold voltage of the memory cell may belong to any one of the Er distribution to the C distribution, but is specified using voltages AR to CR (hereinafter referred to as an AR level to a CR level, respectively) that are read, which are set to be in the vicinities of boundaries of the distributions, respectively. For example, the AR level is used in order to specify whether the threshold voltage of the memory cell belongs to the Er distribution or belongs to the A distribution to the C distribution. The BR level is used in order to specify whether the threshold voltage belongs to the Er distribution or the A distribution, or belongs to the B distribution or the C distribution. The CR level is used in order to specify whether the threshold voltage belongs to the Er distribution to the B distribution, or belongs to the C distribution. Therefore, it is possible that based on a result of the reading that uses a reading voltage (also referred to as a reading level), it is specified whether the threshold voltage that is written to the memory cell belongs to any one of the Er distribution to the C distribution. Then, a data value that is written to the memory cell can be specified based on the specified distribution.

Figure 3:
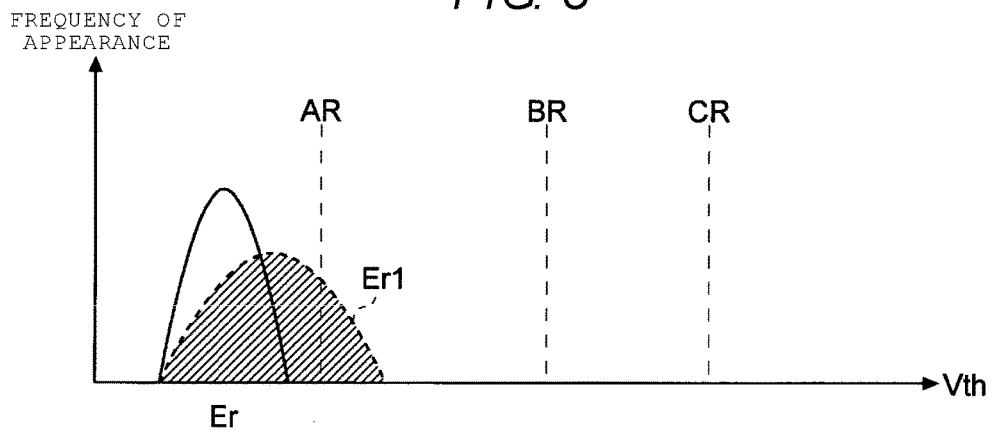
FIG. 3 is a diagram illustrating an example of the threshold voltage distribution of the memory cell that is connected to a non-selected word line that is influenced by read disturbance.

However, as described above, in a case where a charge that is unintended is stored in a certain word line, a threshold voltage of a memory cell that is connected to a non-selected word line that is adjacent to a selected word line may shift and belong to a different threshold voltage distribution. This is illustrated in FIG. 3. It is noted that in FIG. 3, a case is illustrated where the threshold voltage of the memory cell that is connected to the non-selected word line, originally belongs to the Er distribution. As illustrated in FIG. 3 if not influenced by the read disturbance from an adjacent word line, the threshold voltage of the memory cell remains in the Er distribution. However, if influenced by the read disturbance from the adjacent word line, the threshold voltage of the memory cell changes to be within an Er1 distribution that has, for example, a distribution shape, such as one that straddles an AR level, as illustrated in FIG. 3.

Figure 4:
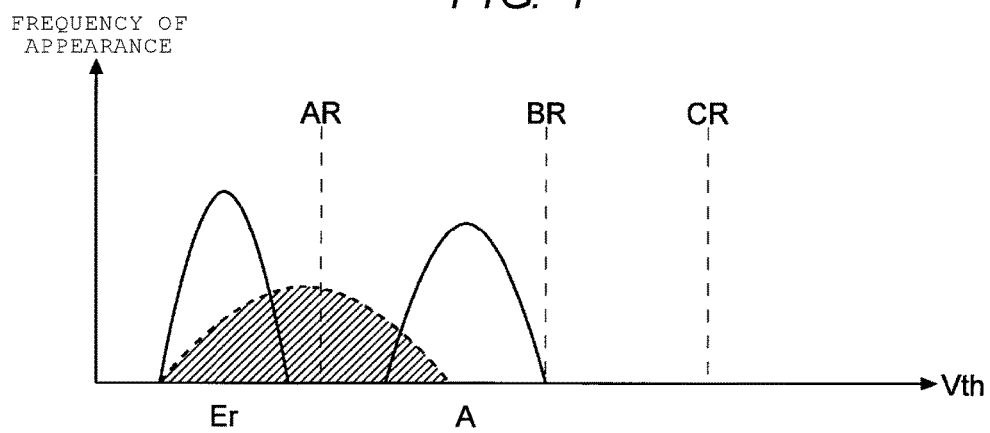
FIG. 4 is a diagram illustrating an example of an influence of the read disturbance, which is sufficiently large that a threshold voltage of the memory cell that is connected to the non-selected word line reaches another threshold voltage distribution.
Figure 5:
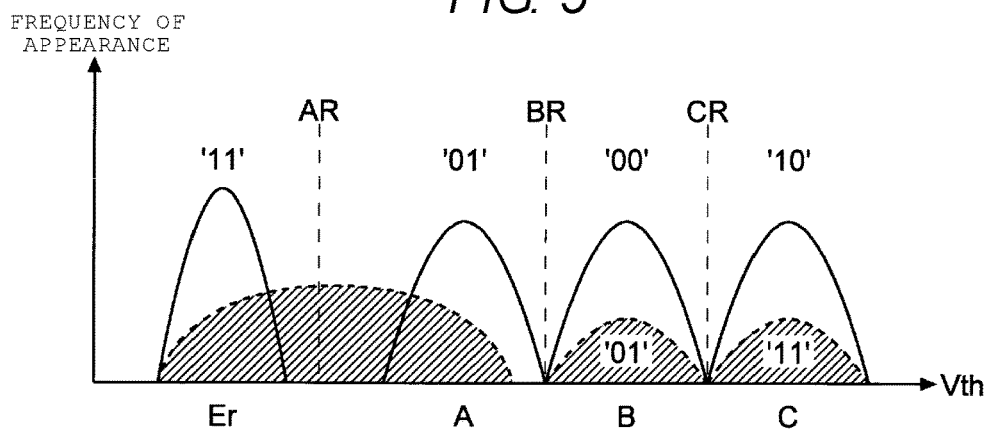
FIG. 5 is a diagram for illustrating an example of a hardware error that occurs due to the influence of the read disturbance.

Furthermore, as illustrated in FIG. 4, in a case where deterioration takes pace due to the influence of the read disturbance, in such a manner that the threshold voltage of the memory cell which is connected to the non-selected word line reaches up to another threshold voltage distribution (for example, the A distribution), in an operation of performing writing to the memory cell, there is a likelihood that false recognition that lower bit data was previously written to the memory cell will occur. In such a case, because the writing of upper bit data is performed in the falsely-recognized state, as illustrated in FIG. 5, a threshold voltage of the memory cell post-writing will belong to a threshold voltage distribution that does not correspond to a data value that is intended. Thus, there is a likelihood that a hardware error will occur.

Accordingly, in the present embodiment, with regard to a memory cell that is influenced by, or is likely to be influenced by the read disturbance, an operation is performed in an operation mode that causes the number of bits, which are to be written to the memory cell, to be decreased. For example, in a case where a memory cell is influenced by or is likely to be influenced by the read disturbance, the memory cell that is designed or is used as the two-bit (four-valued) MLC in a state of not being influenced by the read disturbance is used as a one-bit (two-valued) SLC. Furthermore, for example, in a case where a memory cell is influenced by or is likely to be influenced by the read disturbance, the memory cell that is designed or is used as a three-bit (eight-valued) triple level cell (TLC) in a state of not being influenced by the read disturbance is used as the two-bit (four-valued) MLC or the one-bit (two-valued) SLC.

Figure 6:
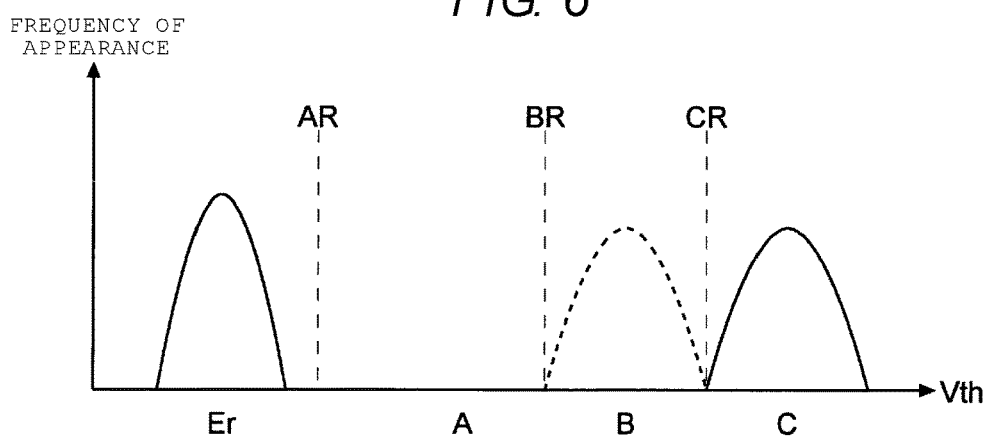
FIG. 6 is a diagram for illustrating an example of the threshold voltage distribution of the memory cell that is used in the present embodiment.
Figure 7:
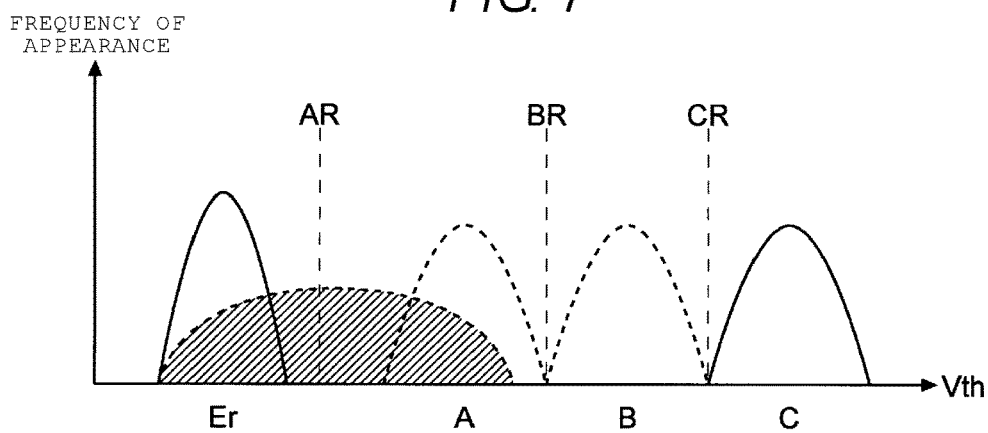
FIG. 7 is a diagram for illustrating an example of the threshold voltage distribution of the memory cell that is influenced by the read disturbance in the present embodiment.

Besides, in the present embodiment, with regard to a memory cell that uses bits of which the number is decreased, a distance between bits in a threshold voltage distribution that corresponds to each data value is made to be greater than a distance between bits in a threshold voltage distribution in a case where the number of bits is not decreased. For example, in a case where a memory cell is the two-bit (four-valued) MLC, as illustrated in FIG. 6, and one-bit (two-valued) data is stored using two states, an erased state (which is equivalent to the Er distribution) and a state where a charge is written most frequently (shown as the C distribution). Accordingly, for example, as illustrated in FIG. 7, even in a case where a threshold voltage distribution is deteriorated, it is possible that overlapping of threshold voltage distributions is avoided or the number of times of overlapping of the threshold voltage distributions is reduced. As a result, although the memory cell is influenced by the read disturbance, it is possible that the reliability is secured without decreasing performance. Furthermore, it is also possible that the number of hardware errors that occur when performing writing on the word line which is influenced by the read disturbance is decreased. It is noted that it is possible in examples in FIGS. 6 and 7 that the B distribution is used instead of the C distribution.

It is noted that in the following description, an operation mode (which is equivalent to a multi-valued mode) that performs normal writing and reading without decreasing the number of bits is referred to as a high bit mode, and an operation mode that decreases the number of bits in such a manner that a peak-to-peak distance in a threshold voltage distribution is made to be great and performs writing and reading is referred to as a low bit mode.

As a condition for switching from the high bit mode to the low bit mode, for example, the total number of times (hereinafter referred to as the total number of times of reading) that the read operation is performed on each block can be used. That is, in a case where the total number of times that reading is performed on a certain block (or a certain page) is at or above a threshold that is set in advance, a configuration can be employed in such a manner that switching of an operating mode for the block (or the page) from the high bit mode to the low bit mode takes place. It is noted that a threshold that serves as a switching condition can be suitably set, for example, with a technique, such as one in which an influence of the read disturbance in accordance with the total number of times of reading is estimated from a statistical result of a device characteristic and is determined based on the total number of times of reading which is to such an extent that the probability that an error bit which is predicted with this estimation will occur cannot be disregarded or cannot be nullified by error correction.

Furthermore, in addition to a configuration in which the operation mode is switched from the high bit mode to the low bit mode based on the total number of times of reading, it is also possible that, for example, a configuration is employed in which the influence of the read disturbance that actually occurs in each block (or each page) is measured at any time or periodically and in which, in a case where the influence of the read disturbance is to such an extent that the probability that the error bit which is predicted with a value measured will occur cannot be disregarded or cannot be nullified by error correction, the operation mode for the block (or the page) is switched from the high bit mode to the low bit mode and so forth. It is noted that it is possible that as a method of measuring the influence of the read disturbance that actually occurs, various methods are used, for example, such as a method in which a threshold voltage of each memory cell is measured in a state where a test pattern that is prepared in advance is written to a block (or page) and in which the influence of the read disturbance that actually occurs is obtained from a threshold voltage distribution that is obtained with the measured threshold voltage.

It is noted that in the following description, as the condition for switching from the high bit mode to the low bit mode, a case is described where the total number of times that reading is performed on each block is employed.

Which block (or page) is operated in the high bit mode and which block (or page) is operated in the low bit mode in the NAND memory 10 can be managed, for example, using a mode management table as illustrated in FIG. 8. In the mode management table, for example, a physical address that designates a physical location in a memory area of the NAND memory 10, a page ID that identifies a page which is designated by the physical address, an operation mode for a page that is specified by the physical address or the page ID, a block ID for identifying a block that includes each page, and the total number of times of reading that indicates the number of times that reading is performed in the past on each block are associated with each other. Therefore, for example, the CPU 23 can specify the operation mode for the page or the block or the total number of times of reading, by referring to the mode management table using the physical address that is specified based on the logical address which is designated by the write command or the read command from the host apparatus 30. It is noted that, for example, as is the case with an address conversion table or the like, the mode management table is read into the RAM 22 at the time of activation, and whenever necessary, is referred to by the CPU 23.

Figure 13:
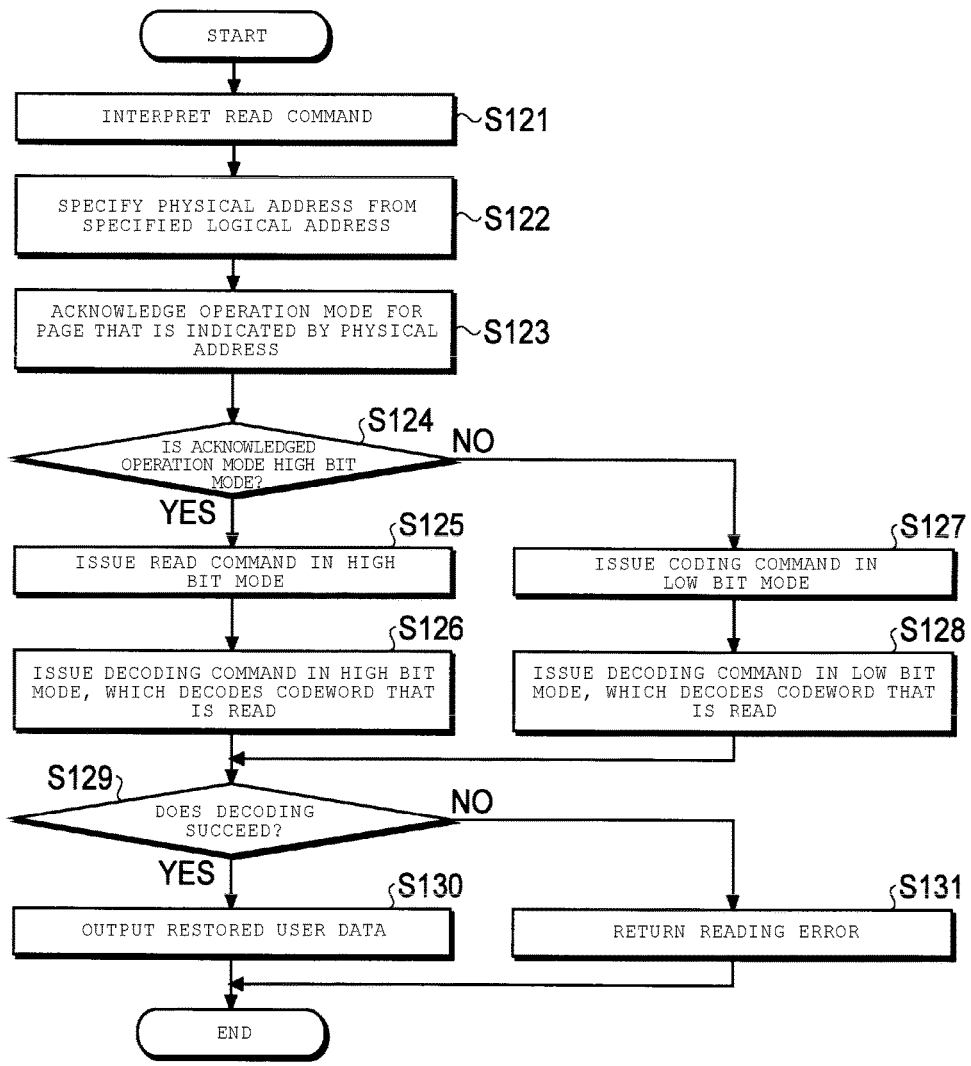
FIG. 13 is a flowchart illustrating an example of a read operation in the memory system according to the present embodiment.

Subsequently, the operation of the memory system according to the present embodiment is described in detail with reference to the drawings. FIGS. 9 to 12 are diagrams for describing a write operation in the memory system according to the present embodiment. FIG. 13 is a diagram for describing a read operation in the memory system according to the present embodiment.

Figure 9:
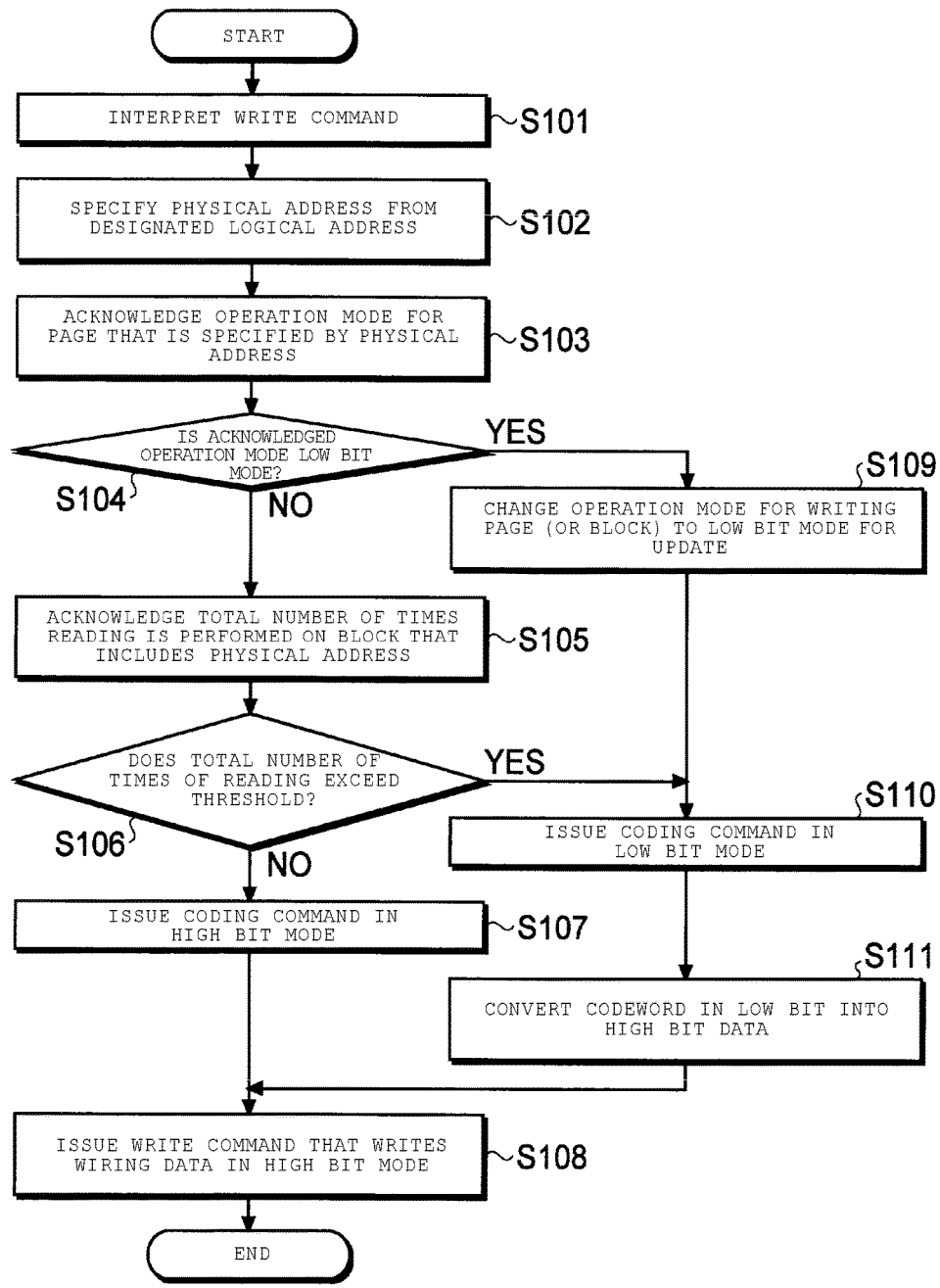
FIG. 9 is a flowchart illustrating an example of a write operation in the memory system according to the present embodiment.

First, the write operation in the memory system 1 is described. FIG. 9 is a flowchart illustrating an example of the write operation in the memory system according to the present embodiment. It is noted that in the following description, the focus is placed on the operation of the CPU 23. Furthermore, in advance of an operation that is illustrated in FIG. 9, it is assumed that a write command from the host apparatus 30 is input into the CPU 23, and that write data that is transferred from the host apparatus 30 is stored in the buffer memory 24.

As illustrated in FIG. 9, the CPU 23 into which the write command is input from the host apparatus 30 through the host interface circuit 21 first interprets the write command (Step S101), and specifies the physical address that indicates one or more pages that are storage destinations of the write data, by referring to the address conversion table based on the logical address that is obtained with this interpretation (Step S102).

Next, the CPU 23 acknowledges the operation mode of the page that indicates the specified physical address, by referring to the mode management table (refer to FIG. 8) (Step S103). Subsequently, the CPU 23 determines whether or not the acknowledged operation mode is the low bit mode (Step S104), and in a case where the acknowledged operation mode is the low bit mode (YES in Step S104), changes the operation mode for the page (or the block) that is managed in the mode management table, to the low bit mode for update (Step S109), and proceeds to Step S110.

On the other hand, in a case where the operation mode for the page is not the low bit mode, that is, in a case where the operation for the page is the high bit mode (NO in Step S104), next, the CPU 23 acknowledges the total number of times that reading is performed on a block which includes a page that is indicated by the physical address which is specified in Step S102, by referring to the mode management table (Step S105). Subsequently, the CPU 23 determines whether or not the total number of times of reading is at or above a threshold that is determined in advance (Step S106), and in a case where the total number of times of reading is at or above the threshold (YES in Step S106), proceeds to Step S110.

On the other hand, the total number of times that reading is performed on a block is below the threshold (NO in Step S106), the CPU 23 issues the coding command in the high bit mode, that is, in the multi-valued mode, to the ECC unit 26 (Step S107), and proceeds to Step S108. In Step S108, the ECC unit 26 codes the write data that is stored in the buffer memory 24, according to the coding command that is input, and thus generates a codeword that is multi-value data (hereinafter referred to as a high bit codeword) and stores the generated codeword in the buffer memory 24.

In Step S110, the CPU 23 issues the coding command in the low bit mode, for example, in a two-valued mode, to the ECC unit 26. Consequently, the ECC unit 26 codes the write data that is stored in the buffer memory 24, according to the coding command that is input, and thus generates a low bit codeword and stores the generated codeword in the buffer memory 24. Subsequently, the CPU 23 performs conversion processing that converts the low bit codeword, which is stored in the buffer memory 24, into a high bit codeword (Step S111), and proceeds to Step S108. Details of the conversion processing in Step S111 will be described below. The high bit codeword that results from the conversion in Step S111, for example, is temporarily stored in the buffer memory 24.

In Step S108, the CPU 23 issues the write command that writes the high bit codeword as writing target data, which is stored in the buffer memory 24, to the NAND memory 10 in the high bit mode, to the memory I/F 25, and thereafter ends the present operation. The memory I/F 25 performs the writing control that writes the writing target data, which is stored in the buffer memory 24, to the NAND memory 10 in the high bit mode. In this manner, in the present embodiment, writing in the same high bit mode is performed on both of the codeword that is generated by the coding in the high bit mode and the high bit codeword that is obtained by converting the codeword which is generated by the coding in the low bit mode.

It is noted that the coding in the high bit mode and the coding in the low bit mode, for example, are different from each other in data length that is a unit for coding. This, as described above in Step S111, is because the codeword that is generated by the coding in the low bit mode is converted into data that has the same number of bits (the same data length) as the codeword which is generated by the coding in the high bit mode. Accordingly, in the present embodiment, in a case where the high bit mode is a two-bit (four-valued) mode and the low bit mode is a one-bit (two-valued) mode, the unit for coding in the coding in the low bit mode is a data length that is half of the unit for coding in the high bit mode, and redundant data (e.g., parity or the like) that is generated by the coding in the low bit mode also has a data length that is half of the redundant data (e.g., the parity or the like) that is generated by the high bit mode.

Subsequently, details of the conversion processing that is illustrated in Step S111 in FIG. 9, are described. In the following description, it is assumed that the codeword that is generated by the coding in the low bit mode, that is, the low bit codeword is '10110101'. Furthermore, it is assumed that the two-bit (four-valued) MLC is used in the memory cell of the NAND memory 10. In such a case, the number of bits of the low bit mode is one and the number of bits of the high bit mode is two.

As described above, writing or erasing of a data value is performed on the two-bit (four-valued) MLC, in such a manner that belonging to any one of the four threshold voltage distributions is now seen as belonging to the Er distribution or the C distribution. That is, in the usual case, a two-bit data value is stored in the two-bit (four-valued) MLC using the four threshold voltage distributions. Thus, in order to store a one-bit data value, there is a need to use only two threshold voltage distributions. Accordingly, in the present embodiment, in the case of the low bit mode, a configuration is employed in such a manner that substantially a one-bit data value is stored in one memory cell by using two threshold voltage distributions that are not adjacent to each other among the four threshold voltage distributions for the MLC.

In order to realize the configuration described above, in the conversion processing that is illustrated in Step S111 in FIG. 9, the codeword that has the number (one bit in the present example) of bits of the low bit mode is converted into data that has the same number of bits (two bits in the present example) as the high bit mode, in such a manner that two threshold voltage distributions that are not adjacent to each other among the four threshold voltage distributions are used.

When this is described using an example that is illustrated in FIG. 2, in a case where the Er distribution corresponds to a data value of "11", where the A distribution corresponds to a data value of "01", where the B distribution corresponds to a data value of "00", where the C distribution corresponds to a data value of "10", and where one bit is stored using the Er distribution and the C distribution that are not adjacent to each other, among these distributions, a data value of "1" in the low bit mode, for example, is converted into the data value of "11" (which corresponds to the Er distribution) in the high bit mode, and a data value of "0" in the low bit mode, for example, is converted into the data value of "10" (which corresponds to the C distribution) in the high bit mode. As a result, a codeword that is generated in the low bit mode, "10110101" is converted into data "11 10 11 11 10 11 10 11".

In the processing for the conversion from the codeword in the low bit mode into the data in the high bit mode, for example, as illustrated in FIG. 10, it is possible that a correspondence table that retains a correspondence relationship between the data value in the low bit mode and the data value in the high bit mode is used. However, as in the example described above, in a case where the data value of "1" in the low bit mode is converted into the data value of "11" in the high bit mode, and where the data value of "0" in the low bit mode is converted into the data value of "10" in the high bit mode, it is possible that data in the low bit mode is easily converted into data in the high bit mode by inserting a fixed bit.

This is described with a specific example. FIG. 11 is a diagram for describing the conversion processing that converts the codeword in the low bit mode into the data in the high bit mode by inserting the fixed bit. In the exemplary embodiment of the present disclosure, it is assumed that in a two-bit data value, a bit on the left side is a "high order bit" and a bit on the left side is a "low order bit". As illustrated in FIG. 11, in a case where the data value of "1" in the low bit mode is converted into the data value of "11" in the high bit mode, and where the data value of "0" in the low bit mode is converted into the data value of "10" in the high bit mode, high order bits in the data values in the high bit mode are all "1". That is, a high order bit in each data value that goes through the conversion is a bit of which a value is fixed to "1".

Accordingly, in the present example, a configuration is employed in such a manner that each bit of the codeword "10110101" which is generated in the low bit mode is inserted as a low order bit and that a high order bit "1" which is a fixed value with respect to each low order bit is inserted as dummy data. Accordingly, it is possible that the codeword in the low bit mode is converted into data in the high bit mode.

In a case where as described above, data that goes through the conversion from the low bit mode to the high bit mode is written to a memory cell, as illustrated in FIG. 12, a threshold voltage of each memory cell belongs to any one of the Er distribution and the C distribution of which peak voltages are widely separated from each other. Accordingly, although a memory cell is influenced by the read disturbance, it is possible that the reliability is secured without decreasing the performance. Furthermore, it is also possible that the number of hardware errors that occur as a result of performing writing on the word line which is influenced by the read disturbance is decreased.

It is noted that in the conversion processing that is described with reference to FIG. 11, a fixed bit is not limited to a high order bit, and may be a low order bit. Furthermore, in a case where a data value in the high bit mode is in three or more bits, it is also possible that one of the intermediate bits that are interposed between a high order bit and a low order bit may be the fixed bit or one of the fixed bits.

Furthermore, the dummy data that is in fixed bits may be inserted by the CPU 23 into the codeword that is stored in the buffer memory 24, and may be inserted by the memory I/F 25 when transferring a codeword within the buffer memory 24 to the NAND memory 10. Alternatively, a configuration may be employed in which when data is actually written to each memory cell within the NAND memory 10, a high order bit may be inserted.

Next, a read operation of the memory system 1 is described. FIG. 13 is a flowchart illustrating an example of the read operation in the memory system according to the present embodiment. It is noted that in the following description, as described with reference to FIG. 9, the focus is placed on the operation of the CPU 23.

As illustrated in FIG. 13, the CPU 23 into which the read command is input from the host apparatus 30 through the host interface circuit 21 first interprets the read command (Step S121), and specifies the logical address that indicates one or more pages in which the reading target user data is stored by referring to the address conversion table based on the physical address that is obtained by this interpretation (Step S122).

Next, the CPU 23 acknowledges the operation mode for the page that is indicated by the specified physical address, by referring to the mode management table (refer to FIG. 8) (Step S123), and determines whether or not the acknowledged operation mode is the high bit mode (Step S124).

In a case where the operation mode is the high bit mode (YES in Step S124), the CPU 23 issues the read command that reads data from the NAND memory 10 in the high bit mode, that is, the multi-valued mode, to the memory I/F 25 (Step S125). Consequently, the memory I/F 25 performs the read operation in the high bit mode (the multi-valued mode) for the specified physical address, on the NAND memory 10, and stores data (which is a codeword) that is read by the read operation, in the buffer memory 24. Furthermore, the CPU 23 issues the decoding command that decodes the data that is stored in the buffer memory 24, to the ECC unit 26 (Step S126), and proceeds to Step S129. Thereafter, the ECC unit 26 reads the data that is stored in the buffer memory 24, decodes the data that is read, and returns a result of the decoding, which is obtained by the decoding, to the CPU 23. It is noted that in a case where the decoding succeeds, the ECC unit 26 stores the restored user data, in the buffer memory 24.

On the other hand, in a case where the operation mode that is acknowledged in Step S123 is the low bit mode (NO in Step S124), the CPU 23 issues the read command that reads data from the NAND memory 10 in the low bit mode, to the memory I/F 25 (Step S127). Consequently, the memory I/F 25 performs the read operation in the low bit mode for the specified physical address, on the NAND memory 10, and stores the data (which is the codeword) that is read by the read operation, in the buffer memory 24. Furthermore, the CPU 23 issues the decoding command that decodes the data that is stored in the buffer memory 24, to the ECC unit 26 (Step S128), and proceeds to Step S129. Thereafter, the ECC unit 26 reads the data that is stored in the buffer memory 24, decodes the data that is read, and returns a result of the decoding, which is obtained by the decoding, to the CPU 23. It is noted that in the case where the decoding succeeds, the ECC unit 26 stores the restored user data, in the buffer memory 24.

In Step S129, the CPU 23 determines whether or not the decoding, which is performed by the ECC unit 26 according to the decoding command in Step S126 or Step S128, succeeds, and in a case where the decoding succeeds (YES in Step S129), transmits the user data, which is stored in the buffer memory 24, to the host apparatus 30 (Step S130) and ends the present operation. On the other hand, in a case where the decoding fails (NO in Step S129), the CPU 23 returns an error that is read, to the host apparatus 30 (Step S131) and ends the present operation.

It is noted that in the read operation that is performed by the memory I/F 25 according to the read command in Step S127, that is, the read operation in the low bit mode, one reading level is used. For example, as in the example described above, in the configuration in which substantially a one-bit data value is stored using two threshold voltage distributions that are not adjacent to each other, among the four threshold voltage distributions for the MLC, it is possible that a data value which is stored in each memory cell is specified with the read operation that uses one reading level. Using the example that is illustrated in FIG. 12, in the read operation in the low bit mode, it can be specified which of the Er distribution and the C distribution the threshold voltage of the memory cell belongs to, for example, by using the CR level. However, no limitation to the CR level is imposed, and it is also possible that the AR level, the BR level, or a read level that is positioned between the AR level and the CR level can be used.

Furthermore, as described above, in a case where the number of read levels that are used in the read operation in the low bit mode is 1, dummy data is not included in the reception word (the read data) that is read. For this reason, it is possible that error correction processing is performed directly on the codeword that is read, without necessitating making necessary an operation of deleting dummy data or an operation of converting a bit value. Accordingly, it is possible that an operation speed at the time of the reading is not reduced.

Accordingly, as described above, according to the present embodiment, with regard to a memory cell that is influenced by, or is likely to be influenced by the read disturbance, the writing and reading in the low bit mode, which cause the number of bits that are written to the memory cell, to be decreased, are performed. Besides, in the present embodiment, with regard to a memory cell uses bits of which the number is decreased, a distance between bits in a threshold voltage distribution that corresponds to each data value is made to be greater than a distance between bits in a threshold voltage distribution in a case where the number of bits is not decreased. Accordingly, even in the case where a threshold voltage distribution is deteriorated, it is possible that overlapping of threshold voltage distributions corresponding to two states is avoided or the number of times of overlapping of the threshold voltage distributions is reduced. As a result, although the memory cell is influenced by the read disturbance, it is possible that the reliability is secured without decreasing performance. Furthermore, it is also possible that the number of hardware errors that occur as a result of performing writing on the word line which is influenced by the read disturbance is decreased.

Figures 14, 15:
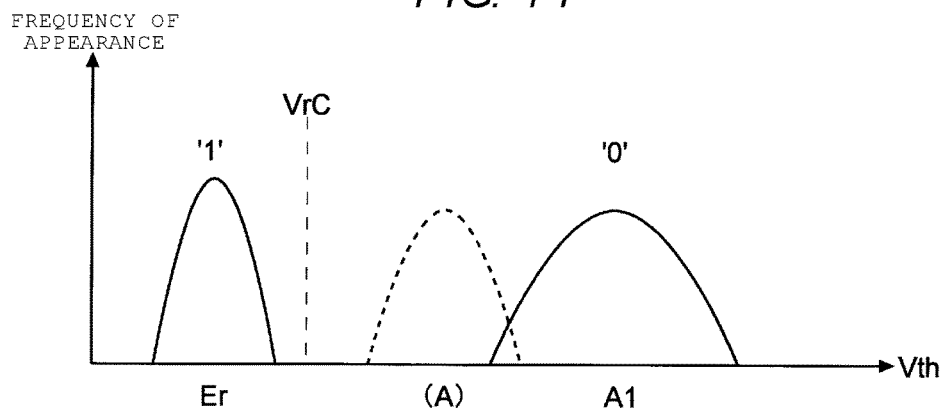
FIG. 14 is a diagram for describing a modification example of the present embodiment.
FIG. 15 is a diagram illustrating a modification example of a mode management table according to the present embodiment.

It is noted that the case is described above where the threshold voltage distributions (for example, the Er distribution and the C distribution) that are used in the low bit mode are selected from among the threshold voltage distributions (for example, the Er distribution to the C distribution in the high bit mode), but that no limitation to this configuration is imposed. For example, as illustrated in FIG. 14, a writing voltage that is applied when writing each data value may be controlled in such a manner that a distance between peaks in a threshold voltage distribution that corresponds to a writing state of each of the data values is made to be greater than a distance between peaks in the high bit mode. In such a case, because there is no need to convert the write data in the low bit mode into the data that has the same number of bits as the write data in the high bit mode, it is possible that the number of times that the processing is performed when performing writing is reduced.

Furthermore, the case is described above where for example, the total number of times of reading is managed on a per-block basis (refer to FIG. 8) and based on this management, switching between the high bit mode and the low bit mode takes place on a per-block basis, but no limitation to this configuration is imposed. That is, for example, various modifications are possible, such as a configuration in which the switching between the high bit mode and the low bit mode takes place on a per-page basis. By employing this configuration, even in a case where the high bit mode and the low bit mode are present in a mixed manner within the same block, because all blocks do not need to be caused to switch to the low bit mode, pages in the low bit mode, which are distributed over a plurality of blocks, do not need to be collected together and be rewritten to another block, and so on, usage efficiency of the NAND memory 10 is improved. Furthermore, because the frequency with which the garbage collection (GC) or the like occurs is reduced, it is possible that a high speed operation is achieved.

It is noted that for example, in a case where a configuration is employed in which the switching between the high bit mode and the low bit mode takes place on a per-page basis, for example, instead of the mode management table that is illustrated in FIG. 8, a mode management table in which the total number of times of reading is managed on a per-page basis, as illustrated in FIG. 15, may be used.

Furthermore, in the embodiment described above, when it comes to the low bit mode, the case where low bit data is converted into high bit data and the resulting data is written to a memory cell is described, but no limitation to this configuration is imposed. That is, instead of the configuration in which the low bit data (for example, one-bit data) is converted into the high bit data (for example, two-bit data), or a configuration in which a specific page, among a plurality of pages that are to be written to each memory cell, is selectively written, in other words, a configuration in which a specific page, among a plurality of pages that are to be written to each memory cell, is not selectively written is also possible. In such a case, for example, when the high bit data is two-bit data, an upper page (which is equivalent to a high order bit) or a lower page (which is equivalent to a low order bit), in the two-bit data, is written to a memory cell, and other pages (lower pages or upper pages) are not written. Even with this configuration, like in the embodiment described above, because it is possible that a distance between peaks in threshold voltage distributions that correspond to data values, respectively, is made to be greater than a distance between peaks in a threshold voltage distribution in a case where the number of bits is not decreased, not only is it possible that the reliability is secured without decreasing the performance, but it is also possible that the number of hardware errors that occur due to writing to a word line that is influenced by the read disturbance is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
   a memory interface that is connectable to a nonvolatile memory that includes a plurality of memory cells;
   a memory including a mode management table indicating, as an operation mode for a group of memory cells including a first memory cell, an n-bit mode (where n is 2 or more) or an m-bit mode (where m is less than n); and
   a processor configured to:
      during a write operation,
      control the memory interface to perform writing of data that has a first number of bits to the first memory cell in the n-bit mode, when the mode management table indicates the n-bit mode as the operation mode, and operate to convert data that has a second number of bits less than the first number into data that has the first number of bits by addition of dummy data and control the memory interface to perform writing of the converted data to the first memory cell in the n-bit mode, when the mode management table indicates the m-bit mode as the operation mode, and
      during a read operation,
      control the memory interface to perform reading of data in the first memory cell in the m-bit mode, when the mode management table indicates the m-bit mode as the operation mode.

2. The memory controller according to claim 1,
   wherein the data that has the first number of bits is two-bit data that includes a high order bit and a low order bit, and
   wherein the dummy data is added as a high order bit of the data that has the second number of bits or as a lower order bit of the data that has the second number of bits.

3. The memory controller according to claim 2,
   wherein when the mode management table indicates the m-bit mode as the operation mode, the first memory cell is programmed into one of only two of four threshold voltage distributions that are achievable with writing in the n-bit mode during the write operation.

4. The memory controller according to claim 3, wherein the two threshold voltage distributions into which the first memory cell is programmed, are non-adjacent threshold voltage distributions among the four threshold voltage distributions that are achievable with writing in the n-bit mode.

5. The memory controller according to claim 1, wherein the group of memory cells is a page of memory cells and an entry of the mode management table corresponding to the page of memory cells indicates a total number of times reading has been carried out with respect to the page of memory cells, the total number being greater than a threshold number.

6. The memory controller according to claim 1, wherein the group of memory cells is a block of memory cells and an entry of the mode management table corresponding to the block of memory cells indicates a total number of times reading has been carried out with respect to the block of memory cells, the total number being greater than a threshold number.

7. A method of performing read and write operations on a nonvolatile memory that includes a plurality of memory cells, said method comprising:
   during a write operation,
   performing writing of data that has a first number of bits to a first memory cell in an n-bit mode (where n is 2 or more), when a mode management table indicating, as an operation mode for a group of memory cells including the first memory cell, the n-bit mode; and
   converting data that has a second number of bits less than the first number into data that has the first number of bits by adding dummy data, and performing writing of the converted data to the first memory cell in the n-bit mode, when the mode management table indicates, as the operation mode, an m-bit mode (where m is less than n); and
   during a read operation,
   performing reading of data in the first memory cell in the m-bit mode, when the mode management table indicates the m-bit mode as the operation mode.

8. The memory controller according to claim 1, wherein the processor is further configured to periodically determine whether or not a predetermined degree of read disturbance is caused on the group of memory cells, and update the operation mode in the mode management table based on a determination result of whether or not the predetermined degree of read disturbance is caused on the group of memory cells.

9. The memory controller according to claim 8, wherein the processor is further configured to determine whether or not the predetermined degree of read disturbance is caused on the group of memory cells at least based on a number of times reading has been carried out with respect to the group of memory cells.

10. The memory controller according to claim 8, wherein the processor is further configured to determine whether or not the predetermined degree of read disturbance is caused on the group of memory cells at least based on writing of a test pattern.

11. The memory controller according to claim 1, wherein during the read operation, the processor is further configured to control the memory interface to perform reading of data in the first memory cell in the n-bit mode, when the mode management table indicates the m-bit mode as the operation mode.

12. A memory system comprising:
a nonvolatile memory that includes a plurality of memory cells; and
a memory controller including:
   a memory interface connectable to the nonvolatile memory;
   a memory including a mode management table indicating, as an operation mode for a group of memory cells including a first memory cell, an n-bit mode (where n is 2 or more) or an m-bit mode (where m is less than n); and
   a processor configured to:
      during a write operation,
      control the memory interface to perform writing of data that has a first number of bits to the first memory cell in the n-bit mode, when the mode management table indicates the n-bit mode as the operation mode, and
      operate to convert data that has a second number of bits less than the first number into data that has the first number of bits by addition of dummy data and control the memory interface to perform writing of the converted data to the first memory cell in the n-bit mode, when the mode management table indicates the m-bit mode as the operation mode, and
      during a read operation,
      control the memory interface to perform reading of data in the first memory cell in the m-bit mode, when the mode management table indicates the m-bit mode as the operation mode.

13. The memory controller according to claim 12, wherein the group of memory cells is a page of memory cells and an entry of the mode management table corresponding to the page of memory cells indicates a total number of times reading has been carried out with respect to the page of memory cells, the total number being greater than a threshold number.

14. The memory controller according to claim 12, wherein the group of memory cells is a block of memory cells and an entry of the mode management table corresponding to the block of memory cells indicates a total number of times reading has been carried out with respect to the block of memory cells, the total number being greater than a threshold number.

15. The method according to claim 7, wherein
when the mode management table indicates the m-bit mode as the operation mode, the first memory cell is programmed into one of only two of four or more threshold voltage distributions that are achievable with writing in the n-bit mode during the write operation.

16. The method according to claim 7, wherein
the data that has the first number of bits is two-bit data that includes a high order bit and a low order bit, and
the dummy data is added as a high order bit of the data that has the second number of bits or as a lower order bit of the data that has the second number of bits.

* * * * *